(12) United States Patent
Turkson et al.

(10) Patent No.: US 10,756,731 B2
(45) Date of Patent: Aug. 25, 2020

(54) POWER SOURCE MULTIPLEXER WITH ADAPTIVE SWITCH CONTROL (71) Applicant: TEXAS INSTRUMENTS INCORPORATED, Dallas, TX (US)

(72) Inventors: Richard Turkson, Princeton, TX (US); Sungho Beck, Plano, TX (US); Jae Won Choi, Dallas, TX (US); Johnny Klarenbeek, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/279,422

(22) Filed: Feb. 19, 2019

(65) Prior Publication Data
US 2020/0076430 A1 Mar. 5, 2020

Related U.S. Application Data (60) Provisional application No. 62/723,787, filed on Aug. 28, 2018.

(51) Int. Cl.
*H03K 17/693* (2006.01)
(52) U.S. Cl.
CPC .................. *H03K 17/693* (2013.01)
(58) Field of Classification Search
None
See application file for complete search history.

(56) References Cited

U.S. PATENT DOCUMENTS

| 8,446,173 | B1 * | 5/2013 | Faucher | H03K 19/00361 |
| | | | | 326/27 |
| 9,338,036 | B2 * | 5/2016 | Poulton | H04L 25/0272 |
| 9,852,859 | B2 * | 12/2017 | Cao | H03K 19/0008 |
| 2013/0195165 | A1 * | 8/2013 | Poulton | H04L 25/0274 |
| | | | | 375/229 |
| 2014/0117975 | A1 * | 5/2014 | Shimomura | H03K 17/005 |
| | | | | 324/140 R |
| 2018/0167067 | A1 * | 6/2018 | Hurrell | H03K 17/693 |
| 2019/0131785 | A1 * | 5/2019 | Vogt | H02H 1/0007 |
| 2019/0229609 | A1 * | 7/2019 | Li | H02M 7/4826 |

* cited by examiner

*Primary Examiner* — Lincoln D Donovan
*Assistant Examiner* — Khareem E Almo
(74) *Attorney, Agent, or Firm* — Mark Allen Valetti; Charles A. Brill; Frank D. Cimino (57) ABSTRACT

A power source multiplexer includes a first switch circuit connected between a first input voltage source node and an output voltage node. A second switch circuit is connected between a second input voltage source node and the output voltage node. A driver circuit is configured to provide a steady-state current to drive one of the first or second switch circuits to electrically connect the respective input voltage source node to the output voltage node. A boost circuit is configured to boost the steady-state current for a switching time interval when switching from one of the input voltage source nodes being connected to the output node to the other of the input voltage source nodes being connected to the output voltage node.

20 Claims, 8 Drawing Sheets

POWER SOURCE MULTIPLEXER WITH ADAPTIVE SWITCH CONTROL

CROSS REFERENCE TO RELATED APPLICATIONS

This application claims the benefit of U.S. Provisional Patent Application 62/723,787 filed on 28 Aug. 2018, and entitled LOW DROPOUT POWER SOURCE MULTIPLEXER WITH ADAPTIVE INRUSH CURRENT CONTROL, the entirety of which is incorporated by reference herein.

TECHNICAL FIELD

This disclosure relates to a power source multiplexer having adaptive switch controls to control switchover between power sources.

BACKGROUND

A Power Source Multiplexer (PSM) is a set of electronic switches used to select and transition between two or more input power sources to provide a single output power source selected from one of the input power sources. A system targeting flexibility to choose between different styles of input power (e.g., battery, barrel-jack, USB cable, wireless charging) may employ a simple set of power switches and logic to select the desired input source to enable output power source. In some applications, a fast or seamless switchover response may be desirable to ensure the system does not lose power and reset during power transitions. In current PSM systems, voltage droops can occur at the output power node when transitioning from one input source to another, where the final operating voltage of the selected input source dips substantially below its steady-state operating value during the transition. Also, excessive current can flow through switch devices during the transition from one input source to another.

SUMMARY

In one example, a power source multiplexer includes a first switch circuit connected between a first input voltage source node and an output voltage node. A second switch circuit is connected between a second input voltage source node and the output voltage node. A driver circuit is configured to provide a steady-state current to drive one of the first or second switch circuits to electrically connect the respective input voltage source node to the output voltage node. A boost circuit is configured to boost the steady-state current for a switching time interval when switching from one of the input voltage source nodes being connected to the output node to the other of the input voltage source nodes being connected to the output voltage node.

In another example, a device includes a first switch circuit having a first control input, a first source input, and a first output coupled to an output node. The device includes a first boost circuit having a first boost input and a first boost output. The first boost output is coupled to the first control input of the first switch circuit. The device includes a first steady-state circuit having a first steady-state input and a first steady-state output. The first steady-state output is coupled to the first control input of the first switch circuit. The device includes a second switch circuit having a second control input, a second source input and a second output coupled to the output node. The device includes a second boost circuit having a second boost input and a second boost output. The second boost output is coupled to the second control input of the second switch circuit. The device includes a second steady-state circuit having a second steady-state input and a second steady-state output. The second steady-state output is coupled to the second control input of the second switch circuit. A control logic circuit having respective outputs is coupled to each of the first boost input, the first steady-state input, the second boost input, and the second steady-state input.

In yet another example, A system includes a control logic circuit configured to generate a control signal to control which of a plurality of input voltage source nodes is connected to an output voltage node. A power source multiplexer is coupled between each of the plurality of input voltage source nodes and the output voltage node. The power source multiplexer is configured to electrically connect one of plurality of input voltage source nodes with the output voltage node in response to the control signal. The power source multiplexer includes a plurality of switch circuits. Each of the switch circuits are coupled between a respective one of the plurality of input voltage source nodes and the output voltage node. A driver circuit is configured to provide a steady-state current to drive one of the plurality of switch circuits to electrically connect the respective input voltage source node to the output voltage node. A boost circuit is configured to boost the steady-state current for a switching time interval when switching from one of the input voltage source nodes being connected to the output voltage node to another of the input voltage source nodes being connected to the output voltage node. A reverse current blocking circuit is configured to delay switching from the one of the input voltage source nodes to the other of the input voltage source nodes.

DETAILED DESCRIPTION

This disclosure relates to a power source multiplexer (PSM) having adaptive controls configured to control switchover between power sources. For example, the adaptive controls can control voltage and/or current waveforms during switchover from one input power source to another. The PSM selects one of multiple input sources to provide output power at an output node of the PSM. The adaptive controls are configured to adaptively apply boost current signals to switching devices of the PSM during switchover from one input power source to another. The adaptive boosting mitigates in-rush current by reducing the time it takes to switch between the respective switching devices of the PSM. The time to switch is reduced because the boost current signal causes the switching devices to turn-on harder. During steady-state operations of the PSM, after the switchover has occurred, steady-state current is supplied to source power to the output node in the absence of boost current signals. In examples, when switching from a higher voltage input source to a lower voltage input source, reverse current blocking circuits can be configured to delay switchover to the lower voltage source until the higher voltage has reached a threshold of the lower voltage source, which further reduces in-rush current in the PSM. Reducing the switching time with dynamic boosting also mitigates voltage drooping at an output node of the PSM during switchover.

In an example, the PSM includes a first switch circuit connected between a first input voltage source node and an output voltage node. The switch device circuits described herein can include multiple series-connected transistors (e.g., source-to-source, drain-to-drain) to support break-before-make operations when switching the input source node to the output node. A second switch circuit (or more if more than two input sources are multiplexed) is connected between a second input voltage source node and the output voltage node. A driver circuit is configured to provide a steady-state current to drive one of the first or second switch circuits to electrically connect the respective input voltage source node to the output voltage node. A boost circuit is configured to boost the steady-state current for a switching time interval during switching from one of the input voltage source nodes being connected to the output node to another of the input voltage source nodes being connected to the output node. By adaptively boosting current to the switch device circuits during transition from one input voltage source node to another, output voltage drooping at the output is reduce compared to over many existing PSM circuits. Also, adaptive boosting allows excessive inrush current to be mitigated over conventional PSM circuits by reducing the boost current after the supply voltage transition has occurred. Moreover, reverse currents can be controlled between switch device circuits by delaying switchover between supply rails until one input voltage source node is within a set threshold voltage of the other before enabling the switchover.

As used herein, the term "circuit" can include a collection of active and/or passive elements that perform a circuit function, such as an analog circuit or digital circuit. Additionally or alternatively, for example, the term "circuit" can include an integrated circuit (IC) where all or some of the circuit elements are fabricated on a common substrate (e.g., semiconductor substrate, such as a die or chip), such as disclosed herein. For example, the PSM and/or other control circuitry may be implemented as a respective IC chip.

Figure 1:
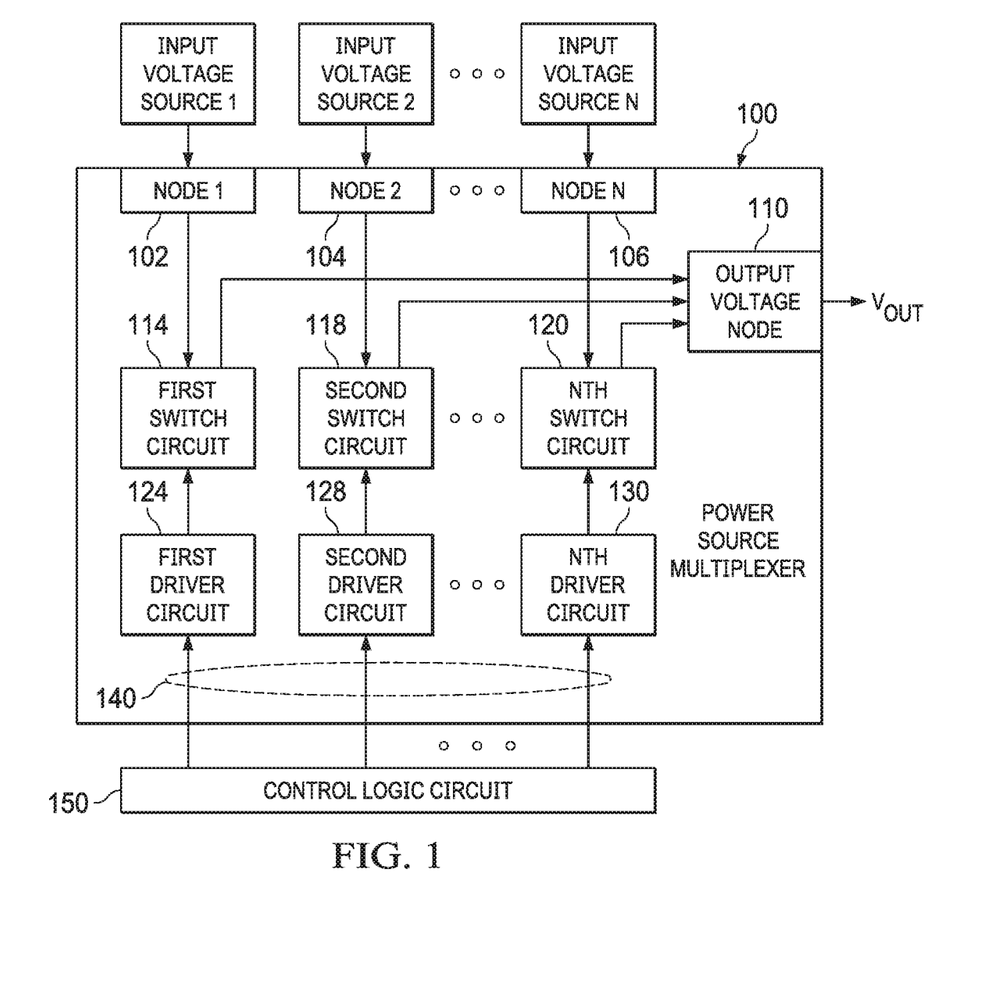
FIG. 1 illustrates an example block diagram of a power source multiplexer that employs adaptive switch control to switch input power sources to an output node of the multiplexer.

FIG. 1 illustrates an example of a PSM 100 that is configured to employ adaptive controls to switch one of multiple input power sources, shown as input voltage source 1, input voltage source 2, and input voltage source N, to an output voltage node 110 of the PSM, where N is a positive integer greater than or equal to two. The PSM 100 includes N input sources shown as input voltage source node 102, input voltage source node 104 and input voltage source node 106. In this example, the input voltage source node 102, input voltage source node 104, and input voltage source node 106 is coupled to the respective input voltage source 1, input voltage source 2, and input voltage source N. In some examples, the input voltage source node 1, input voltage source node 2, and/or input voltage source node N can be a low dropout (LDO) source. A low-dropout or LDO regulator is a direct-current (DC) linear voltage regulator that can regulate the output voltage even when the supply voltage is very close to the output voltage. In other examples, the input voltage source node 1, input voltage source node 2, and/or input voltage source node N can be switching power supplies or regulators such as boost regulators, buck regulators, and/or buck/boost regulators. The PSM 100 also includes a first switch circuit 114 connected between input voltage source node 102 and the output voltage node 110. At least a second switch circuit 118 is connected between an input voltage source node 104 and the output voltage node 110. As shown, the PSM 100 can include an Nth switch device circuit 120 connected between input voltage source node 106 that is coupled to the output voltage node 110 the PSM 100.

The PSM 100 also includes driver circuits shown as a first driver circuit 124, a second driver circuit 128, and an Nth driver circuit 130. The driver circuits 124, 128 and 130 are configured to drive one of the switch circuits 114, 118 and 120 to couple a respective input voltage source node 102, 104 or 106 to the output voltage node 110. For example, the first driver circuit 124, the second driver circuit 128, and the Nth driver circuit 130 are configured to provide a steady-state current to drive one of the first switch circuit 114, second switch circuit 118, or Nth switch circuit 120, respectively, to electrically connect the respective input voltage source node 102, 104 or 106 to the output voltage node 110. Each of the driver circuits 124, 128 and 130 includes a boost circuit (see e.g., FIGS. 2 and 3) that is configured to boost the steady-state current for a switching time interval when switching from one of the input voltage source nodes being connected to the output voltage node 110 to another of the input voltage source nodes being connected to the output node. The steady-state current referred to herein is the normal operating mode current (non-transition mode between one supply to another) for switch devices in the first driver circuit 124, second driver circuit 128, and Nth driver circuit 130 and is less than boost current described herein to mitigate power consumption during steady-state operations of the PSM 100.

In the example of FIG. 1, the first driver circuit 124 can be configured to control switching of the first switch circuit 114, the second driver circuit 128 is configured to control switching of the second switch circuit 118 and the Nth driver circuit 130 is configured to control switching of the Nth switch circuit 120. A control logic circuit 150 is configured to provide respective control signals to each of the driver circuits 124, 128 and 130. As used herein, the control logic circuit 150 can include discrete components configured to control the driver circuits 124, 128 and 130. Alternatively or additionally, the control logic circuit 150 can include an integrated control circuit, a controller, microcontroller, gate array, and/or a processor that executes machine-readable instructions to perform its control function. For example, the control logic circuit 150 thus provides the control signals to command the first driver circuit 124, the second driver circuit 128, and the Nth driver circuit 130 to provide steady-state current to drive the first switch circuit 114, the second switch circuit 118, and the Nth switch circuit 120, respectively, to electrically connect the input voltage sources coupled to NODE 1, NODE 2, and NODE N to the output voltage node 110 in response to control signals 140.

The control logic circuit 150 further can be configured to provide control signals to command the first driver circuit 124, the second driver circuit 128, and the Nth driver circuit 130 to supply boost current to the first switch circuit 114, the second switch circuit 118, and the Nth switch circuit 120 respectively. The boost current is supplied to one of the switch circuits 114, 118 or 120 for a switching time interval during switching from one input voltage source node to another to provide power to the output voltage node 110. For example, the boost current is supplied for short time-periods associated with the switching interval as determined by the control logic circuit 150. The boost current thus is applied to switching devices within the first switch circuit 114, the second switch circuit 118, or the Nth switch circuit 120 of the PSM 100 to mitigate output voltage drooping and in-rush current within the PSM during switchover from one input voltage source to another. In-rush current and voltage drooping may be mitigated by reducing the time it takes to switch between the respective switching devices of the PSM 100 because the switching devices in the first switch circuit 114, the second switch circuit 118, and the Nth switch circuit 120 are turned-on harder for short time-periods due to the boost current. The boost currents are turned off during steady-state operations of the PSM 100 after the switchover has occurred.

As described above, the control logic circuit 150 can be configured to generate the control signals 140 to operate the first driver circuit 124, the second driver circuit 128, and Nth driver circuit 130. Operations of the control logic circuit 150, the switch circuits 114, 118 and 120 along with driver circuits 124, 128, and 130 are further described below with respect to FIGS. 2 and 3. Operations of the control signals 140 are further described below with respect to FIGS. 4 through 8. In an example, the first switch circuit 114, the second switch circuit 118, the Nth switch circuit 120, the first driver circuit 124, the second driver circuit 128, and the Nth driver circuit 130, and/or the control logic circuit 150 can be implemented as an integrated circuit (IC) chip.

Figure 2:
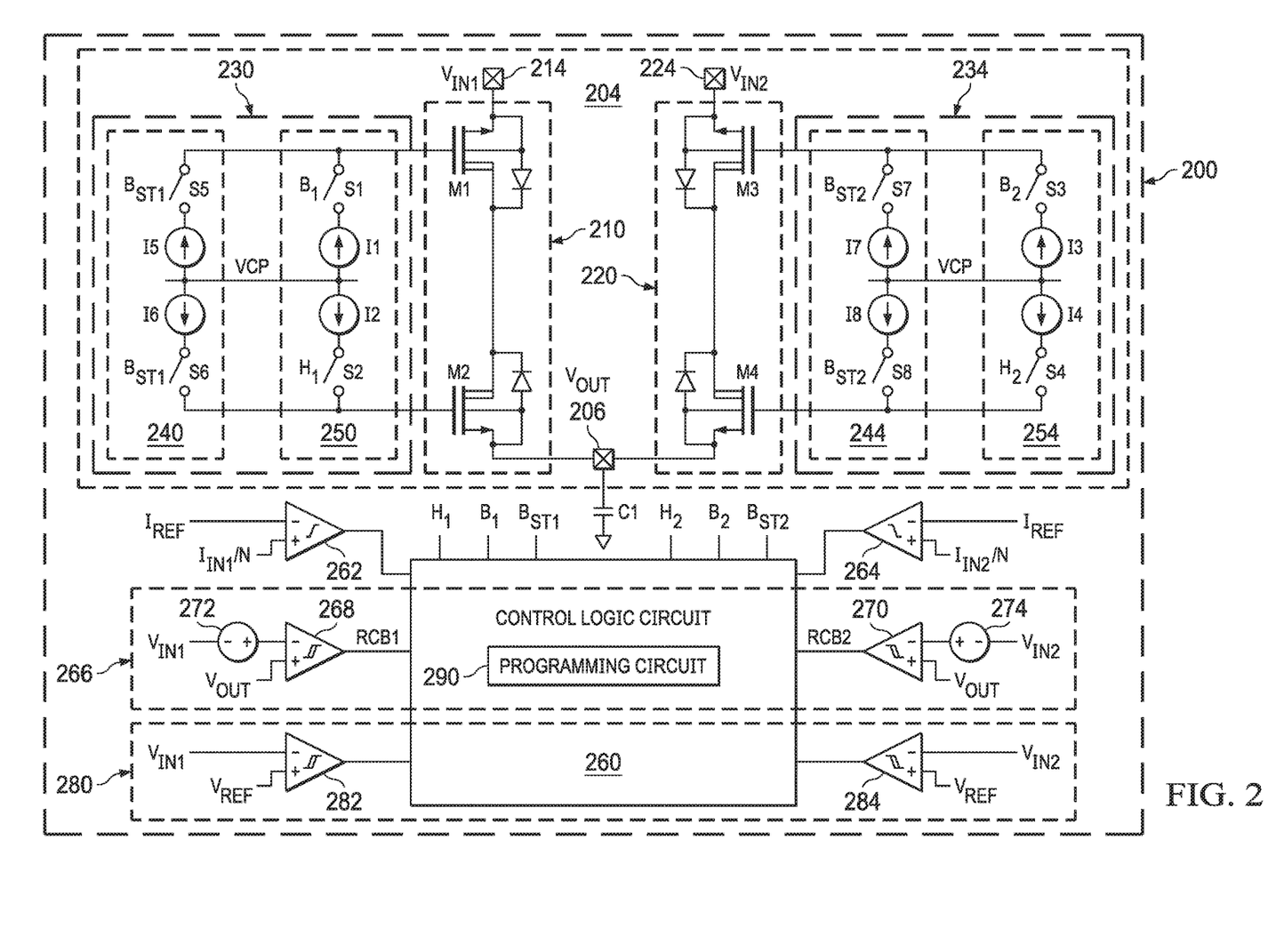
FIG. 2 illustrates an example of a device that employs adaptive switch control to switch input power sources to an output node of the multiplexer.

FIG. 2 illustrates an example of a device 200 that includes a PSM 204 configured to implement adaptive switching to connect one of multiple input voltage nodes shown as first input voltage source node 214 and second input voltage source node 224 with an output voltage node 206. In this example, two input power sources, shown as VIN1 and VIN2. A capacitor C1 can be coupled to the output voltage node 206 to filter the DC output. While the example of FIG. 2 includes two input voltage nodes represented as first input voltage source node 214 and second input voltage source node 224, as described previously herein, in other examples, any number N of input nodes can be switched by the PSM 204 to connect a respective one of N voltage sources with the output voltage node 206.

As a further example, the PSM 204 includes a first switch circuit 210 connected between first input voltage source node 214 and the output voltage node 206. A second switch circuit 220 is connected between a second input voltage source node 224 and the output voltage node 206. The first switch circuit 210 and the second switch circuit 220 is driven by a respective driver circuit shown as a first driver circuit 230 driving the first switch circuit and a second driver circuit 234 driving the second switch circuit. The first driver circuit 230 is configured to provide a steady-state current to drive the first switch circuit 210 and the second driver circuit 234 is configured to provide steady-state current to drive the second switch circuit 220.

The first driver circuit 230 includes a first boost circuit 240. The first boost circuit 240 is configured to boost the steady-state current of the first driver circuit 230 for a switching time interval when switching from one of the input voltage source nodes being connected to the output voltage node 206 to the other of the input voltage source nodes being connected to the output node. Similarly, a second boost circuit 244 is configured to boost the steady-state current of the second driver circuit 234 for a switching time interval when switching from the first input voltage source node 214 being connected to the output voltage node 206 to the second input voltage source node 224 being connected to the output node.

The first driver circuit 230 includes a first steady-state circuit 250 configured to provide a first steady-state current to drive the first switch circuit 210 to electrically connect the first input voltage source node 214 to the output voltage node 206. The first boost circuit 240 is configured to boost the first steady-state current for the switching time interval. The second driver circuit 234 includes a second steady-state circuit 254 configured to provide a second steady-state current to drive the second switch circuit 220 to electrically connect the second input voltage source node 224 to the output voltage node 206. The second boost circuit 244 is configured to boost the second steady-state current for the switching time interval.

A control logic circuit 260 is configured to generate control signals H1, B1, and BST1 to control the first driver circuit 230 and control signals H2, B2, and BST2 to control the second driver circuit 234. Control signals H1 and B1 control the first steady-state circuit 250, the control signal BST1 controls switching of the first boost circuit 240, the control signals H2 and B2 control switching of the second steady-state circuit 254, and the control signal BST2 controls switching of the second boost circuit 244. The first switch circuit 210 includes transistor switch devices M1 and M2 and the second switch circuit 220 includes transistor switch devices M3 and M4. For example, the transistor switch devices M1 and M2 are connected in series and configured to switch the first input voltage source node 214 to the output voltage node 206 in response to the control signals H1 and B1, where control signal BST1 is asserted when switching. As used herein, the term connected in series (or series-connected) refer to how the transistor switch devices (e.g., M1 and M2) are connected to each other. In one example, as shown in FIG. 2, connected in series refers to a drain-to-drain connection between the devices as shown. In another example, the series connection could be a source-to-source connection. Bipolar arrangements of such devices are possible (e.g., emitter-to-emitter or collector-to-collector). Transistor switch device M3 and M4 are connected in series and configured to switch the second input voltage source node 224 to the output voltage source node 206 in response to the control signals H2 and B2, where control signal BST2 is asserted when switching.

In this example, the control logic circuit 260 provides control signals H1/B1 and H2/B2 to control respective transistor switch devices M1/M2 and M3/M4 to enable make-before-break operation. For example, transistor switch devices M1 and M3 are activated before respective transistors M2 and M4 during a source supply switchover to facilitate switchover operations. As used herein, the term make-before break, refers to energizing at least one of the switch devices (e.g., M1 or M3) before turning on a series connected device in the first switch circuit 210 or the second switch circuit 220 (e.g., series transistor device M2 or M4 in the respective switch circuits).

The first steady-state circuit 250 includes steady-state switch devices S1 and S2 to control switching in the first steady-state circuit. The second steady-state circuit 254 includes steady-state switch devices S3 and S4 to control switching in the second steady-state circuit. The steady-state switch devices S1 and S2 are configured to connect steady-state current sources I1 and I2 to apply steady-state current to the series-connected transistor switch devices M1 and M2 in response to the control signals B1 and H1. The steady-state switch devices S3 and S4 are configured to connect steady-state current sources I3 and I4 to apply steady-state current to the series-connected transistor switch devices M3 and M4 in response to the control signals B2 and H2. As shown, the current sources I1, I2, I3 and I4 are connected to an internal supply rail VCP which is configured as a higher voltage potential than either of the voltages supplied to the first input voltage source node 214 and the second input voltage source node 224.

The first boost circuit 240 includes switches S5 and S6. The boost switches S5 and S6 are configured to connect boost current sources I5 and I6 to apply the boost current to the series-connected transistor switch devices M1 and M2 in response to the control signal BST1. The second boost circuit 244 includes switches S7 and S8. The boost switches S7 and S8 are configured to connect boost current sources I7 and I8 to apply the boost current to the series-connected transistor switch devices M3 and M4 in response to the control signal BST2.

The control logic circuit 260 is configured to control on-time of the respective boost switches S5/S6 and S7/S8 based on comparing current in one of the transistor switch devices M1/M2 and M3/M4 with respect to a reference current. Comparator 262 monitors a reference current IREF with respect to a scaled input current IN1/N sensed from the first switch circuit 210. Comparator 264 monitors reference current IREF with respect to a scaled input current IN2/N sensed from the sensed from the second switch circuit 220. Sensed input current IN1 or IN2 can be scaled by a scaling factor N before being provided to the comparator 262 or comparator 264. For example, current can be sensed by placing a differential amplifier (not shown) across M1 or M3 where the sensed differential voltage across transistor switch devices M1 or M3 correlates to the amount of current flowing.

As a further example, the voltages applied to the first input voltage source node 214 and second input voltage source node 224 may be at different voltage levels. In one example, the first input voltage source node 214 is configured at a higher voltage potential than the second input voltage source node 224. In other examples, both input source nodes can be set at about the same voltage level. The control logic circuit 260 can include a reverse current blocking circuit 266. For the example where a higher input voltage is applied to first input voltage source node 214 than the second input voltage source node 224, a reverse current blocking circuit 266 can be configured to delay connecting the second input voltage source node 224 to the output voltage node 206. Reverse current blocking circuit is based on comparing the voltage VOUT at the output voltage node 206 to a blocking threshold voltage that is based on the second input voltage source node plus an offset voltage, demonstrated at offset voltage 272 and offset voltage 274.

For example, the reverse current blocking circuit 266 can include blocking comparators 268 and 270 having an input to receive an offset voltage 272 and offset voltage 274 for the first input voltage source node 214 and the second input voltage source node 224 and another input to receive the output voltage VOUT. Thus, when switching VOUT from a higher potential to a lower potential, blocking comparators 268 and 270 delay switchover from the higher node to the other, lower voltage node until the higher voltage supply has come within a given offset voltage of the lower voltage. The threshold may be predetermined, such as set to a default or user-programmable value. In this manner, the reverse current blocking circuit 266 can impose a time delay to mitigate reverse currents flowing between the first switch circuit 210 and the second switch circuit 220 due to voltage potential between the first input voltage source node 214 and the second input voltage source node 224.

The control logic circuit 260 may also include a priority circuit 280. The priority circuit 280 includes priority comparators 282 and 284 to monitor VIN1 and VIN2 with respect to a reference voltage threshold VREF. The priority circuit 280 is configured to monitor the first input voltage source node 214 and the second input voltage source node 224 with respect to the priority threshold. The priority circuit 280 is configured to cause a switchover from one input source node to the other input source node if an input designated as a priority source is detected crossing the priority threshold VREF. Such priority designation can be made within a programming circuit 290. For example, programming circuit 290 may include analog programming (e.g., resistor present or absent indicates which node has priority) and/or digital programming such as in a register bank or memory. The programming circuit 290 can be configured to enable setting of a reference current threshold IREF. This can include programmable settings for a reverse current blocking threshold by setting a value for offset voltage 272 and offset voltage 274. A priority threshold VREF can be programmed in the programming circuit 290. Also, one of the input voltage source nodes can be selected as a priority node in the programming circuit 290.

The first steady-state circuit 250 and second steady-state circuit 254 provides drive current ID to the respective series-connected transistor devices M1/M2 and M3/M4. Drive current provided to M1 and M3 can be configured to be about four times higher than that supplied to M2 and M4 but other ratios are possible. Boost current which is additive to drive current ID described herein can be much higher than the steady-state current (e.g., 100 times higher than steady-state). Boost current provided to M1 and M3 can be configured to be about four times higher than boost current supplied to M2 and M4 but other boost current ratios are possible.

Figure 3:
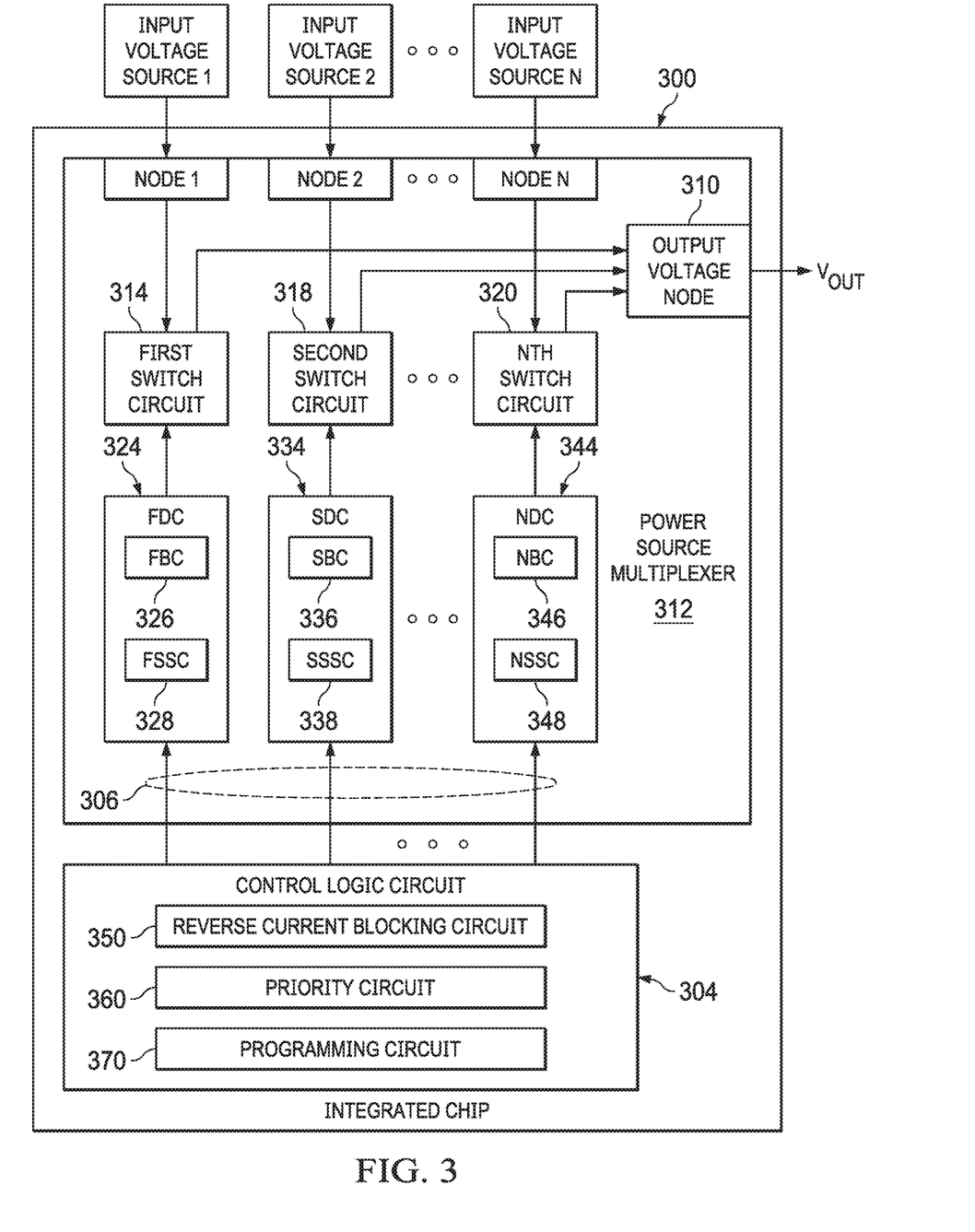
FIG. 3 illustrates an example of a system on an integrated circuit that employs adaptive switch control to switch input power sources to an output node of the multiplexer.

FIG. 3 illustrates an example of a system 300 that can be fabricated on an integrated circuit (e.g., an IC chip). The system 300 is configured to employ adaptive control to switch input power sources to an output node of a multiplexer. A control logic circuit 304 is configured to generate control signals 306 to control a power source multiplexer (PSM) 312 to switch from at least a first input voltage source node shown as node 1 at 301 coupled to input voltage source 1, and a second input voltage source node shown as node 2 at 302 coupled to input voltage source node 2, and node N shown at 303 coupled to input voltage source N to an output voltage node 310. The PSM 312 is configured to provide an output voltage VOUT to the output voltage node 310 by selecting between the first input voltage source node 301, the second input voltage source node 302, or the Nth input voltage source node 303 in response to the control signals 306.

The PSM 312 includes a first switch circuit 314, a second switch circuit 318, and an Nth switch circuit 320. The first switch circuit 314 is configured to switch the first input voltage source node 301 to the output voltage node 310 in response to the control signals 306. The second switch circuit 318 is configured to switch the second input voltage source node 302 to the output voltage node 310 in response to the control signals 306. If more than two input voltage sources are to be switched, the Nth switch circuit 320 can be provided to switch input voltage source N to the output voltage node 310. A first driver circuit 324 is configured to control switching of the first switch circuit 314. The first driver circuit 324 includes a first boost circuit 326 (e.g., having first boost switch devices) configured to provide boost current to drive the first switch circuit. A first steady-state circuit 328 (e.g., having first steady-state current sources) is configured to provide a steady-state current that is less than the boost current to drive the first driver circuit 324. The first driver circuit 324 boosts current supplied by the first steady-state circuit 328 when switching, for example, of the first input voltage source node 301 and the second input voltage source node 302 to the output voltage node 310.

A second driver circuit 334 is configured to control switching of the second switch circuit 318. The second driver circuit 334 includes a second boost circuit 336 (e.g., having second boost switch devices) configured to provide boost current to drive the second switch circuit 318. A second steady-state circuit 338 (e.g., having second steady-state current sources) is configured to provide steady-state current that is less than the boost current to drive the second switch circuit 318. The second driver circuit 334 boosts current supplied by the second steady-state circuit 338 when switching of the second input voltage source node 302 and the first input voltage source node 301 to the output voltage node 310. If an Nth switch circuit 320 is included, an Nth driver circuit 344 can be provided that includes an Nth boost circuit 346 and an Nth steady-state circuit 348.

As a further example, the control logic circuit 304 can include a reverse current blocking circuit 350 configured to delay switching from one of the first or second input voltage sources based on switching of the input voltage source nodes to the output voltage node 310. The control logic circuit 304 can also include a priority circuit 360 to monitor the input voltage sources with respect to a priority threshold. The priority circuit 360 causes a switchover from one input voltage source to another if an input designated as a priority source is detected crossing the priority threshold. In examples, where there are more than two input voltage nodes, the priority circuit 360 is configured to establish a priority among the respective input voltages nodes. The control logic circuit 304 can also include a programming circuit 370.

The programming circuit 370 can be configured to enable setting of a reference current threshold IREF that establishes control of the boost current timing described herein. This can include programmable settings for a reverse current blocking threshold by setting a value for offset voltages described above with respect to FIG. 2. A priority threshold VREF can be programmed in the programming circuit 370 which controls a value for the priority threshold described herein. Also, one of the input voltage source nodes can be selected as a priority node in the programming circuit 370 such that if an input voltage source that is detected as a priority source after crossing the priority threshold, the control logic circuit 304 will initiate a switchover to the voltage source programmed as the priority source.

Figure 4:
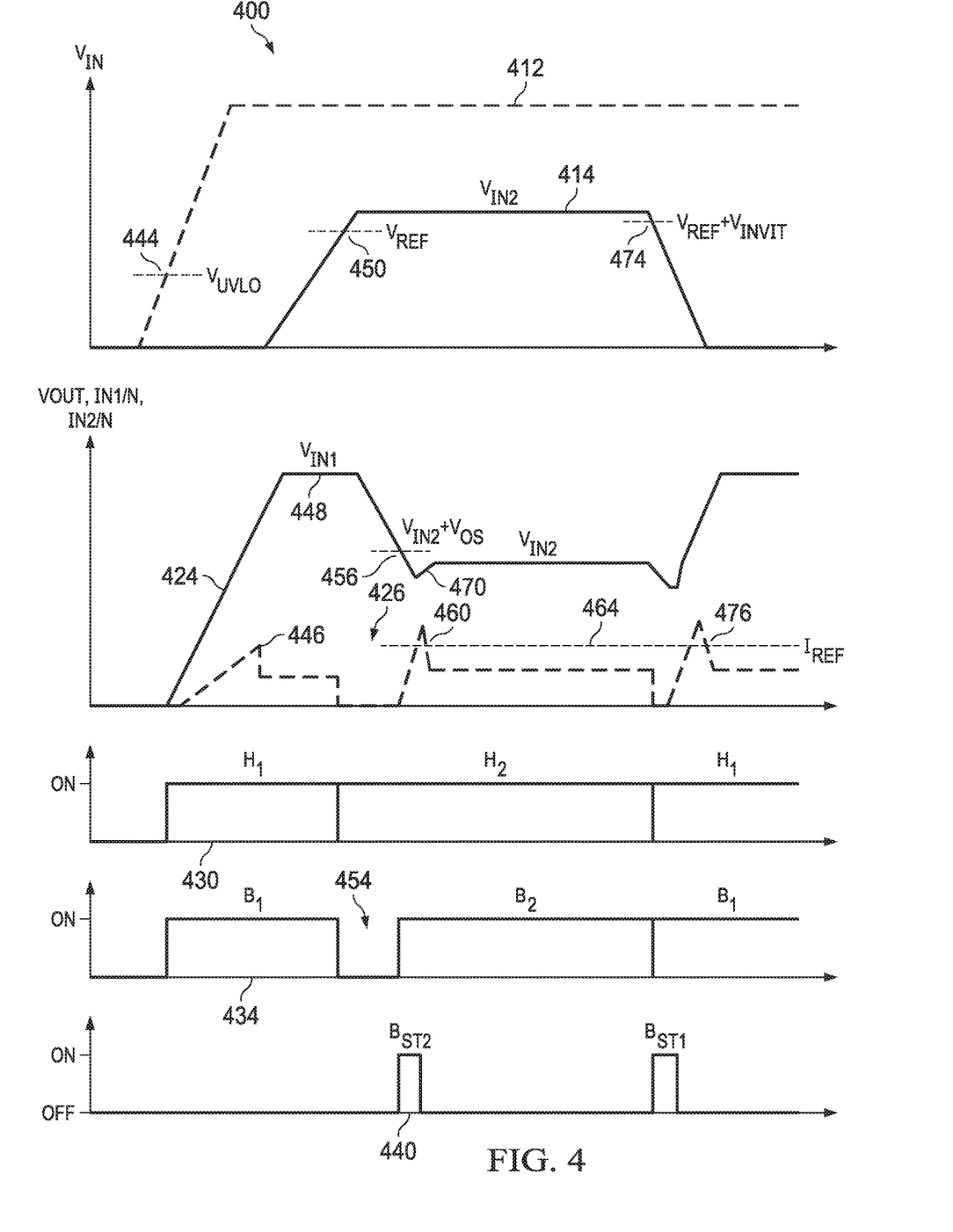
FIG. 4 illustrates an example timing and waveform diagram for the circuit, device, and system illustrated in FIG. 1, 2, or 3.

FIG. 4 illustrates an example timing and waveform diagram 400 for various signals of a PSM (e.g., the circuit, device, and system illustrated in FIGS. 1-3). The waveform diagram 400 shows input voltage waveforms VIN1 at 412 and VIN2 at 414 that are applied to the input voltage source nodes 102 and 104, or 214 and 224, or 301 and 302 described herein. Voltage is represented on the vertical axis and time is represented on the horizontal axis. An output voltage waveform 424 is represented for the output voltage node 110, output voltage node 206, or output voltage node 310 described herein in volts on the vertical axis whereas a switch circuit current waveform associated with the respective input voltage source nodes is shown at 426. Time is represented on the horizontal axis. Control signal states shown at 430 and 434 represents steady-state control signals H1 and B1 for the first steady-state circuit 250 or 328 described herein and steady-state control signals H2 and B2 for the second steady-state circuit 254 or 338 described herein with respect to time on the horizontal axis. Control signal states shown at 440 represents boost signals BST1 and BST2 that are applied to the respective first boost circuit 240 or 326 and the second boost circuit 244 or 336 described herein with respect to time.

Initially, VIN1 at 412 begins to rise and is applied to node 1 102, 214, or 301. When VIN1 reaches a threshold at 444, control signals H1 and B1 are asserted and applied to the respective steady-state circuits, where VOUT shown at 424 begins to rise and tracks input voltage source VIN1. Also, input current IN1/N begins to rise at 446 and levels off when VOUT at 424 reaches steady-state at 448. After a period of time, input source VIN2 begins to rise at 414 and when it reaches a threshold shown at VREF 450, a multiplexer switchover is initiated because VIN2 is programmed as the priority supply as the source for VOUT. At 450, H1 and B1 are both switched off shutting off the first switch circuit 210 and H2 is asserted. A time delay occurs at 454 before B2 is asserted. The time delay is caused by the reverse current blocking circuit 266 or 350 described herein to mitigate reverse currents flowing back into the input power supply the first and second switch circuits.

When a reverse current blocking threshold (e.g., VIN2 plus an offset voltage) is reached at 456, control signal B2 is asserted turning on the second steady-state circuit 254 or 338. Also, at this time, when threshold 456 is reached, boost signal BST2 is asserted until IN2/N at 460 reaches a current threshold IREF at 464. This short boost period mitigates voltage drooping in VOUT shown at 470 during switchover from one input voltage source to another, such as disclosed herein. After the threshold IREF is reached at 460, the boost signal BST2 is de-asserted which reduces steady-state current in the switch circuit after the transition from one input voltage source to the other. At 474, another switchover is initiated when the priority supply VIN2 falls below a threshold. At this time, control logic (e.g., control logic circuit 150, 260, or 304) de-asserts H2 and B2 of the second switch circuit and asserts H1 and B1 of the first switch circuit. Also, boost signal BST1 for the first boost circuit 240 or 326 is asserted until current in the first steady-state circuit 250 or 328 crosses threshold IREF such as shown at 476.

Figure 5:
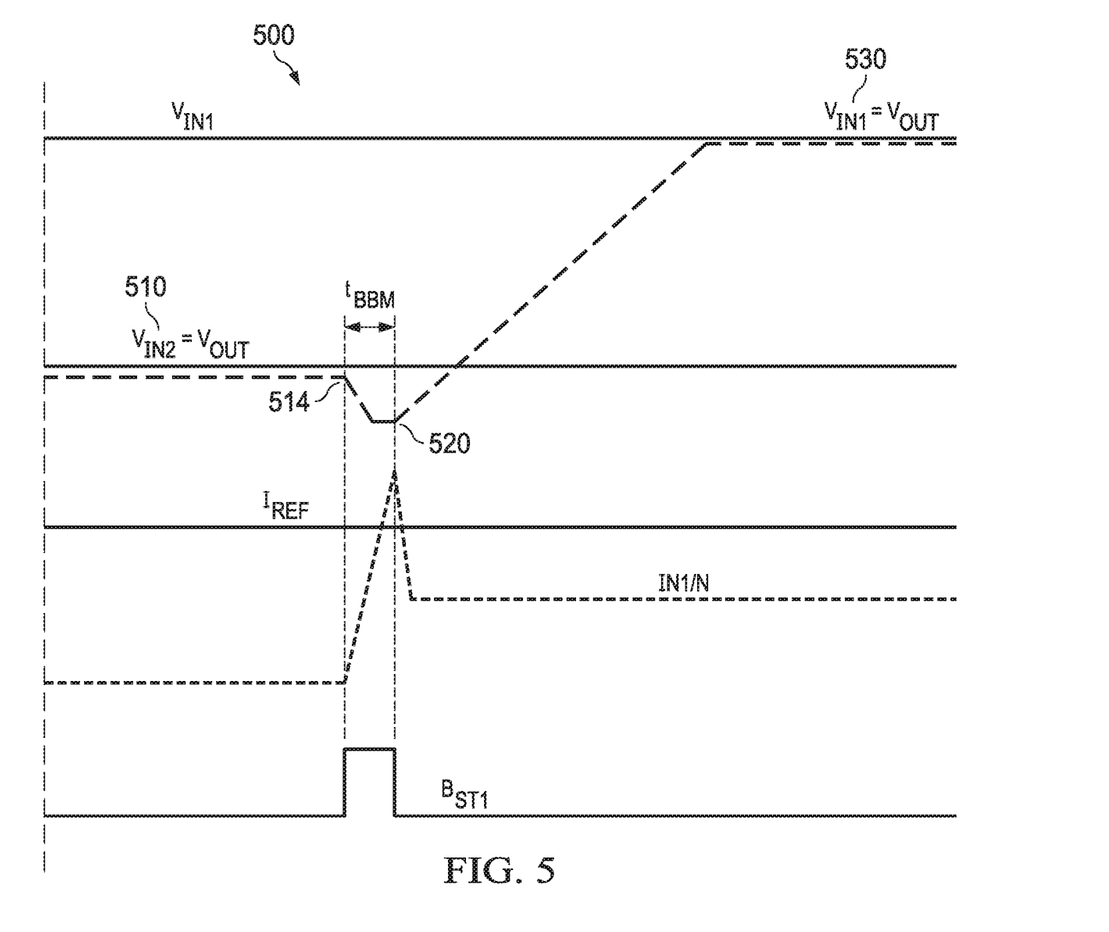
FIG. 5 illustrates an example timing and waveform diagram that shows a transition from a lower voltage input source to a higher voltage input source.

FIG. 5 illustrates an example timing and waveform diagram 500 that shows a transition implemented by a PSM to switch from a lower voltage input source VIN2 to a higher voltage input source VIN1 (e.g., the circuit, device, and system illustrated in FIGS. 1-3). At 510, VIN2 represents the value of VOUT at output voltage node 110, output voltage node 206, or output voltage node 310. At 514, a switchover occurs and boost signal BST1 is applied to the first boost circuit 240 or 326 until current in the first switch circuit 214 or 314 IN1 reaches a current threshold IREF when BST1 is de-asserted. The time that the boost signal BST1 is applied is shown as break-before-make time tBBM and reduces voltage dropping in VOUT shown at 520. At 530, VOUT is switched to about the value of VIN1.

Figure 6:
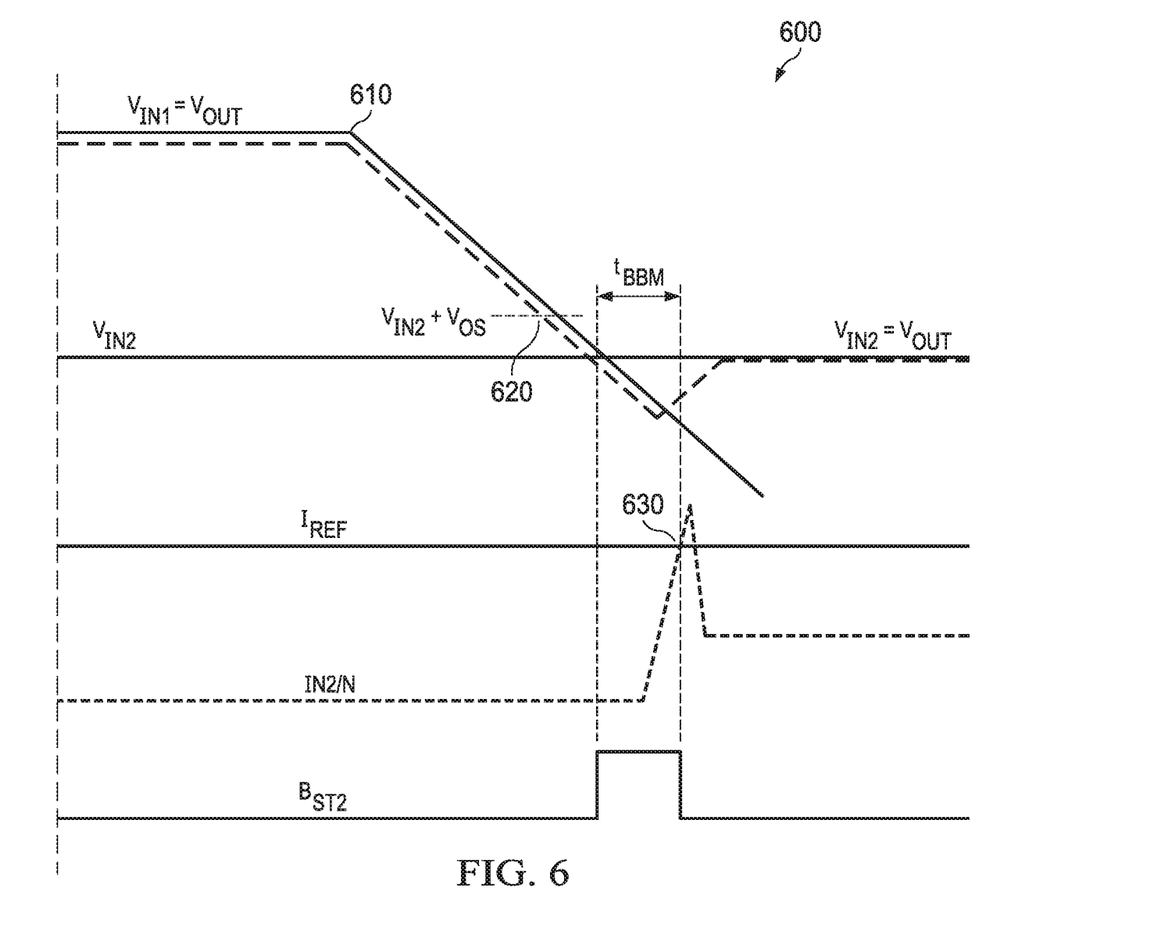
FIG. 6 illustrates an example timing and waveform diagram that shows a transition from a higher voltage input source to a lower voltage input source.

FIG. 6 illustrates an example timing and waveform diagram 600 that shows a transition by a PSM switching from a higher voltage input source VIN1 to a lower voltage input source VIN2 (e.g., the circuit, device, and system illustrated in FIGS. 1-3). At 610, a transition event is detected and a switchover begins where VIN1 is transitioning over to VIN2 to supply VOUT of the PSM related to output voltage node 110, output voltage node 206, or output voltage node 310. In this example, switchover is delayed to mitigate reverse current flowing between the first switch circuit 114, 210, or 314 and the second switch circuit 118, second switch circuit 220, or second switch circuit 318. The delay continues until a reverse current blocking threshold is reached at 620 which is set at the value of VIN2 plus an offset voltage VOS. At 620, a switchover is initiated where BST2 is asserted to the second boost circuit 244 or 336 and remains until IN2/N of the second switch circuit 118, 220, or 318 crosses current threshold IREF at 630. At 630, BST2 is de-asserted. The time delay described herein for switching VOUT from a higher voltage supply to a lower on is set such that switching does not occur until VIN1 falls close to the level of VIN2. This delay mitigates reverse currents from flowing between the switch circuits to protect the input power supplies.

Figure 7:
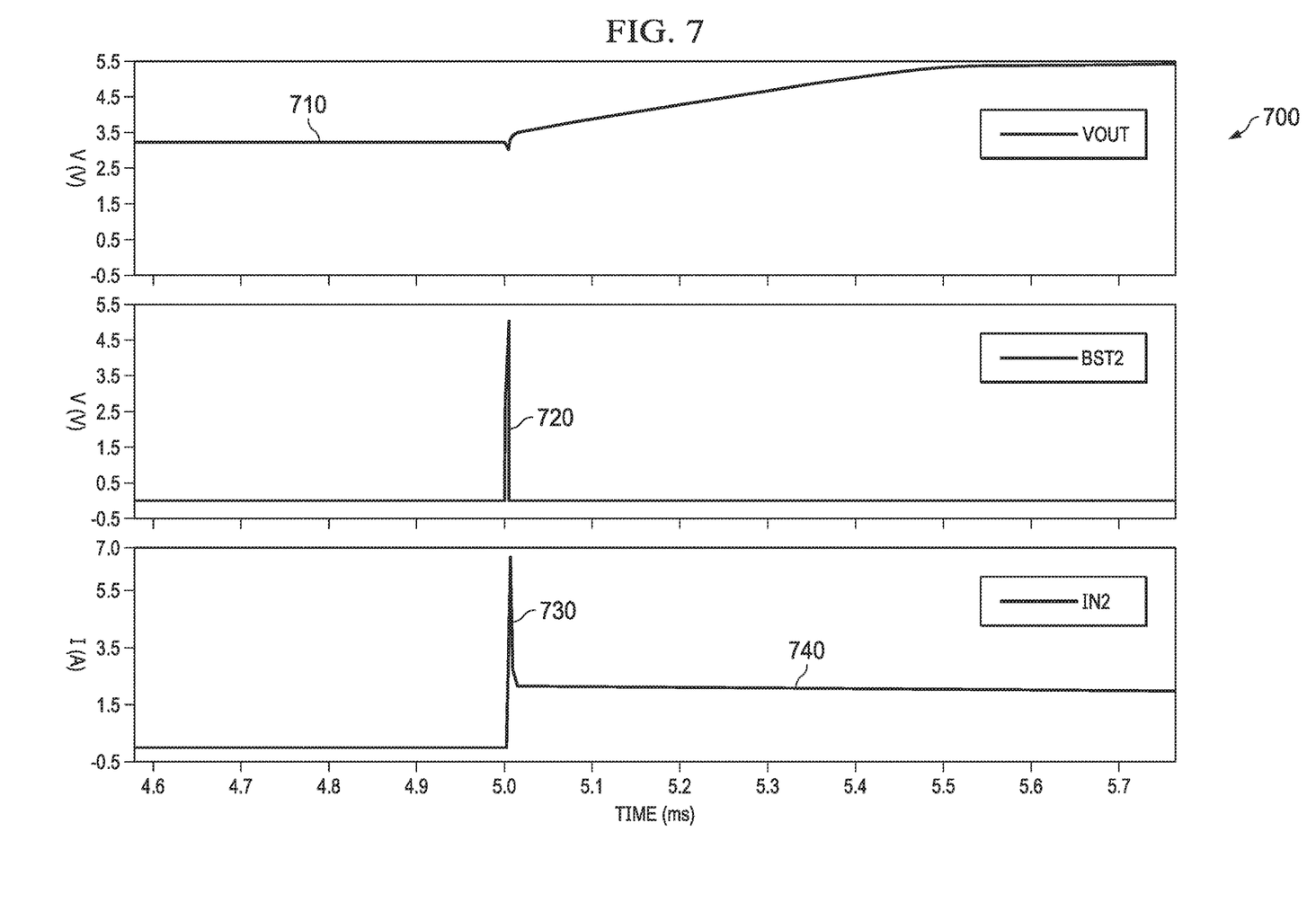
FIG. 7 illustrates an example timing and waveform diagram that shows in-rush current during a transition from a lower voltage input source to a higher voltage input source.

FIG. 7 illustrates an example timing and waveform diagram 700 that shows in-rush current during a transition by a PSM switching from a lower voltage input source to a higher voltage input source (e.g., the circuit, device, and system illustrated in FIGS. 1-3). As shown at 710, VOUT begins to transition from a lower value to a higher voltage value. For a short period, boost signal BST2 is asserted at 720 to mitigate drooping of VOUT. At 730, boost current in the switch circuit is increased for a short period and then is leveled off to a steady-state voltage value at 740 to mitigate steady-state current in the PSM after the transition.

Figure 8:
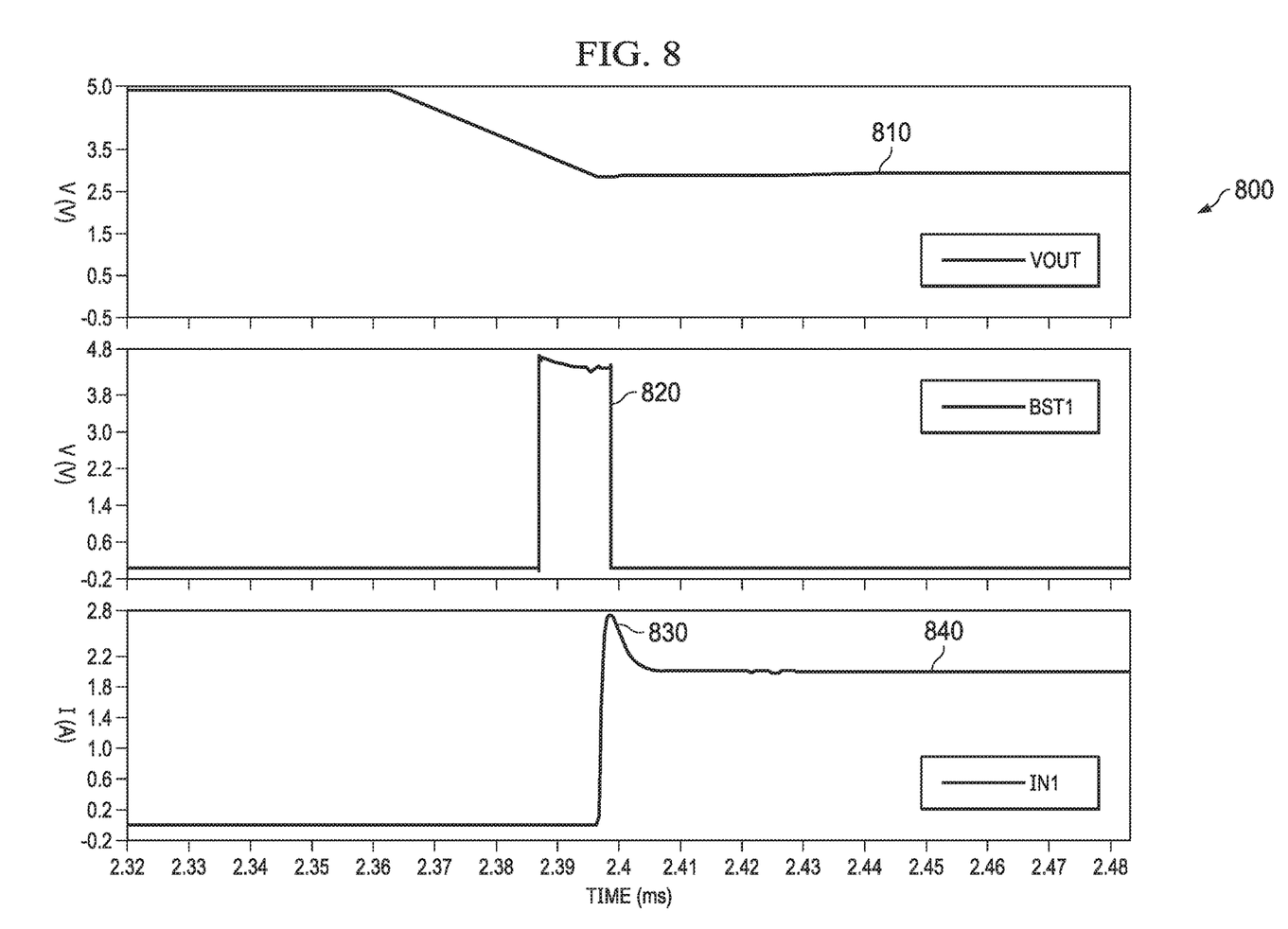
FIG. 8 illustrates an example timing and waveform diagram that shows in-rush current during a transition from a higher voltage input source to a lower voltage input source.

FIG. 8 illustrates an example timing and waveform diagram 800 that shows in-rush current during a transition by a PSM switching from a higher voltage input source to a lower voltage input source (e.g., the circuit, device, and system illustrated in FIGS. 1-3). As shown at 810, VOUT begins to transition from a higher value to a lower voltage value. After a time delay, for a short period, boost signal BST1 is asserted at 820 to mitigate drooping of VOUT. At 830, boost current in the switch circuit is increased for a short period and then is leveled off to a steady-state value at 840 to mitigate steady-state current in the PSM after the transition.

What have been described above are examples. It is, of course, not possible to describe every conceivable combination of components or methods, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. A power source multiplexer, comprising:
    a first switch circuit connected between a first input voltage source node and an output voltage node;
    a second switch circuit connected between a second input voltage source node and the output voltage node;
    a driver circuit configured to provide a steady-state current to drive one of the first or second switch circuits to electrically connect the respective input voltage source node to the output voltage node; and
    a boost circuit configured to boost the steady-state current for a switching time interval when switching from one of the input voltage source nodes being connected to the output voltage node to another of the input voltage source nodes being connected to the output voltage node, wherein the switching time interval is determined based on comparing current in at least one of the switch circuits with a reference current.

2. The power source multiplexer of claim 1, wherein the driver circuit includes a first driver circuit and a second driver circuit, the first driver circuit includes:
    a first steady-state circuit configured to provide a first steady-state current to drive the first switch circuit to electrically connect the first input voltage source node to the output voltage node; and
    a first boost circuit configured to boost the first steady-state current for the switching time interval;
    the second driver circuit includes:
    a second steady-state circuit configured to provide a second steady-state current to drive the second switch circuit to electrically connect the second input voltage source node to the output voltage node; and
    a second boost circuit configured to boost the second steady-state current for the switching time interval.

3. The power source multiplexer of claim 2, further comprising a control logic circuit configured to generate control signals to control each of the first driver circuit and the second driver circuit.

4. The power source multiplexer of claim 3, wherein the first switch circuit comprises transistor switch devices connected in series and configured to switch the first input voltage source node to the output voltage node in response to respective control signals, and
    wherein the second switch circuit includes transistor switch devices connected in series and configured to switch the second input voltage source node to the output voltage node in response to respective control signals.

5. The power source multiplexer of claim 4, wherein the transistor switch devices connected in series is a drain-to-drain connection or a source-to-source connection between the switch devices.

6. The power source multiplexer of claim 4,
    wherein the first steady-state circuit further comprises steady-state switch devices that are configured to connect first steady-state current sources to apply steady-state current to the respective series-connected transistor switch devices of the first switch circuit in response to the respective control signals when the first input voltage source node is connected to the output voltage node;
    wherein the first boost circuit further comprises first boost switch devices that are configured to connect respective boost current sources to apply boost current to the series-connected transistor switch devices of the first switch circuit in response to the control signals during a switching time interval for a transition from the from the second input voltage source node being connected to the output voltage node to the first input voltage source node being connected to the output voltage node, wherein the second steady-state circuit further comprises steady-state switch devices that are configured to connect second steady-state current sources to apply steady-state current to the series-connected transistor switch devices of the second switch circuit in response to the respective control signals when the second input voltage source node is connected to the output voltage node, wherein the second boost circuit further comprises second boost switch devices that are configured to connect respective boost current sources to apply boost current to the series-connected transistor switch devices of the second switch circuit in response to the control signals during a switching time interval for a transition from the first input voltage source node being connected to the output voltage node to the second input voltage source node being connected to the output voltage node.

7. The power source multiplexer of claim 6, wherein the control logic circuit is configured to control on-time of the respective boost switches based on comparing current in one of the transistor switch devices with respect to a reference current.

8. The power source multiplexer of claim 3, wherein the first input voltage source node is configured at a higher voltage potential than the second input voltage source node, and wherein the control logic circuit further comprises a reverse current blocking circuit configured to delay connecting the second input voltage source node to the output voltage node based on comparing the output voltage node to a blocking threshold voltage that is based on the second input voltage source node and an offset voltage.

9. The power source multiplexer of claim 3 wherein the control logic circuit further comprises a priority circuit configured to trigger a switchover from one input source node to a priority source in response detecting a voltage of the priority source crossing a priority threshold.

10. The power source multiplexer of claim 3, wherein the control logic circuit further comprises a programming circuit configured to enable setting of at least one of a reference current threshold, a reverse current blocking threshold, a priority threshold, and to select one of the input voltage source nodes as a priority node.

11. The power source multiplexer of claim 1, wherein the first switch circuit, the second switch circuit, the driver circuit, and the boost circuit are implemented as an integrated circuit (IC) chip.

12. A device, comprising:
a first switch circuit having a first control input, a first source input, and a first output coupled to an output node and including transistor switch devices connected in series and configured to switch a first input voltage source node to an output voltage node in response to a first control signal;
a first boost circuit having a first boost input and a first boost output, the first boost output coupled to the first control input of the first switch circuit;
a first steady-state circuit having a first steady-state input and a first steady-state output, the first steady-state output coupled to the first control input of the first switch circuit;
a second switch circuit having a second control input, a second source input and a second output coupled to the output node and including transistor switch devices connected in series and configured to switch a second input voltage source node to the output voltage node in response to a second control signal;
a second boost circuit having a second boost input and a second boost output, the second boost output coupled to the second control input of the second switch circuit;
a second steady-state circuit having a second steady-state input and a second steady-state output, the second steady-state output coupled to the second control input of the second switch circuit; and
a control logic circuit having respective outputs coupled to each of the first boost input, the first steady-state input, the second boost input, and the second steady-state input, and generating the first control signal and second control signal.

13. The device of claim 12, wherein the first boost circuit and the second boost circuit are configured to boost a steady-state current of the first steady-state circuit or the second steady-state circuit for a switching time interval when switching from one of the first source input to the output node or the second source input to the output node.

14. The device of claim 12,
wherein the first steady-state circuit further comprises steady-state switch devices that are configured to connect first steady-state current sources to apply steady-state current to the respective series-connected transistor switch devices of the first switch circuit in response to the respective control signals when the first source input is connected to the output node;
wherein the first boost circuit further comprises first boost switch devices that are configured to connect respective boost current sources to apply boost current to the series-connected transistor switch devices of the first switch circuit in response to the control signals during a switching time interval for a transition from the from the second input voltage source node being connected to the output voltage node to the first input voltage source node being connected to the output voltage node,
wherein the second steady-state circuit further comprises steady-state switch devices that are configured to connect second steady-state current sources to apply steady-state current to the series-connected transistor switch devices of the second switch circuit in response to the respective control signals when the second source input is connected to the output node,
wherein the second boost circuit further comprises second boost switch devices that are configured to connect respective boost current sources to apply boost current to the series-connected transistor switch devices of the second switch circuit in response to the control signals during a switching time interval for a transition from the first source input being connected to the output node to the second source input being connected to the output node.

15. The device of claim 14, wherein the control logic circuit is configured to control on-time of the boost switches based on comparing current in one of the transistor switch devices with respect to a reference current.

16. The device of claim 15, wherein the first source input is configured at a higher voltage potential than the second input voltage source node, and wherein the control logic circuit further comprises a reverse current blocking circuit configured to delay connecting the second source input to the output node based on comparing the output node to a blocking threshold voltage that is based on the second source input and an offset voltage.

17. The device of claim 12, wherein the control logic circuit further comprises a priority circuit configured to trigger a switchover from one input source to a priority source in response to detecting a voltage of the priority source crossing a priority threshold.

18. A system, comprising:
- a control logic circuit configured to generate a control signal to control a plurality of input voltage source nodes is connected to an output voltage node;
- a power source multiplexer coupled between each of the plurality of input voltage source nodes and the output voltage node, the power source multiplexer configured to electrically connect one of plurality of input voltage source nodes to the output voltage node in response to the control signal, the power source multiplexer further comprising:
- a plurality of switch circuits, each coupled between a respective one of the plurality of input voltage source nodes and the output voltage node;
- a driver circuit configured to provide a steady-state current to drive one of the plurality of switch circuits to electrically connect the respective input voltage source node to the output voltage node;
- a boost circuit configured to boost the steady-state current for a switching time interval when switching from one of the input voltage source nodes being connected to the output voltage node to another of the input voltage source nodes being connected to the output voltage node, wherein the switching time interval is determined based on comparing current in at least one of the switch circuits with a reference current; and
- a reverse current blocking circuit configured to delay switching from one of the input voltage source nodes to the other of the input voltage source nodes.

19. The system of claim 18, wherein the control logic circuit further comprises a priority circuit configured to trigger a switchover from one input source node to a priority source in response to detecting a voltage of the priority source crossing a priority threshold.

20. The system of claim 19, wherein the control logic circuit further comprises a programming circuit configured to enable setting of at least one of a reference current threshold, a reverse current blocking threshold, a priority threshold, and to select one of the input voltage source nodes as the priority source.

* * * * *